United States Patent
Park et al.

(10) Patent No.: US 12,148,857 B2
(45) Date of Patent: Nov. 19, 2024

(54) METHOD OF MANUFACTURING MICRO-LED DISPLAY

(71) Applicant: SAMSUNG ELECTRONICS CO., LTD., Suwon-si (KR)

(72) Inventors: Joonyong Park, Suwon-si (KR); Seogwoo Hong, Yongin-si (KR); Kyungwook Hwang, Seoul (KR); Hyunjoon Kim, Seoul (KR); Junsik Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 585 days.

(21) Appl. No.: 17/477,875

(22) Filed: Sep. 17, 2021

(65) Prior Publication Data

US 2022/0190192 A1    Jun. 16, 2022

Related U.S. Application Data

(60) Provisional application No. 63/125,646, filed on Dec. 15, 2020.

(30) Foreign Application Priority Data

Mar. 29, 2021    (KR) ........................ 10-2021-0040541

(51) Int. Cl.
*H01L 27/15*    (2006.01)
*H01L 33/00*    (2010.01)
*H01L 33/62*    (2010.01)

(52) U.S. Cl.
CPC .......... *H01L 33/005* (2013.01); *H01L 27/156* (2013.01); *H01L 33/62* (2013.01); *H01L 2933/0066* (2013.01)

(58) Field of Classification Search
None
See application file for complete search history.

(56) References Cited

U.S. PATENT DOCUMENTS

| 10,700,052 B2 | 6/2020 | Ninan et al. |
| 2017/0133558 A1 | 5/2017 | Sasaki et al. |

(Continued)

FOREIGN PATENT DOCUMENTS

| JP | 2004-096037 A | 3/2004 |
| JP | 2010-087066 A | 4/2010 |
| JP | 4613489 B2 | 1/2019 |

OTHER PUBLICATIONS

Anonymous, "202002_SDC OLED", 2020, 64 pages total.

(Continued)

*Primary Examiner* — Feifei Yeung Lopez
(74) *Attorney, Agent, or Firm* — Sughrue Mion, PLLC

(57) ABSTRACT

Provided is a method of manufacturing a display, the method including a first operation of transferring a plurality of micro light emitting diodes (LEDs) to a plurality of wells of an interposer through a fluidic self assembly (FSA) process, a second operation of aligning a driving substrate on the interposer, a third operation of injecting a penetrating solvent between the interposer and the driving substrate, such that the penetrating solvent penetrates between the plurality of micro LEDs and the plurality of wells, and a fourth operation of transferring the plurality of micro LEDs to the driving substrate by radiating light to the interposer to vaporize the penetrating solvent.

18 Claims, 14 Drawing Sheets

(56) References Cited

U.S. PATENT DOCUMENTS

2018/0012873 A1    1/2018  Lee et al.
2018/0309023 A1*  10/2018  Crowder ............... H01L 27/156

OTHER PUBLICATIONS

Pastel, et al. "Wrap-around electrodes for microLED tiled displays", 2020, Journal for Society for Information Display, 6 pages total 2020:28:463.468.
Bian, et al. "Laser Transfer, Printing, and Assembly Techniques for Flexible Electronics", 2019, Flexible Electronics, 33 pages total. Adv. Electronics Materials. 2019::5:1800900.

\* cited by examiner

METHOD OF MANUFACTURING MICRO-LED DISPLAY

CROSS-REFERENCE TO RELATED APPLICATIONS

This application is based on and claims benefit of U.S. Provisional Application No. 63/125,646, filed on Dec. 15, 2020 in the United States Patent and Trademark Office, and claims priority under 35 U.S.C. § 119 to Korean Patent Application No. 10-2021-0040541, filed on Mar. 29, 2021, in the Korean Intellectual Property Office, the disclosures of which are incorporated by reference herein in their entireties.

BACKGROUND

1. Field

Example embodiments of the present disclosure relate to a method of manufacturing a micro LED display.

2. Description of Related Art

Industrial demand for light emitting diodes (LEDs) is increasing due to advantages including low power consumption and eco-friendliness, and LEDs are being applied to lighting devices, liquid crystal display (LCD) backlights, and self-luminous display devices. Although a LCD, which is a large-size display being widely used nowadays, has price competitiveness, the implementation of a form factor is limited due to the rigidity of a substrate glass and a backlight unit (BLU), the energy efficiency is low, and, in particular, there is a limit to the implementation of high-quality images due to low contrast ratio (CR) and slow response speed.

On the contrary, a recent prototype micro LED display is a self-luminous display in which micro LEDs in the micrometer scale are mounted on pixel positions of a driving substrate and has advantages such as high brightness, high power efficiency, long lifespan, and implementation of various form factors. However, a transfer process of positioning micro LEDs in the micrometer scale to pixel positions of a driving substrate is performed by a pick-and-place method, which is difficult to guarantee productivity and economic feasibility. In particular, in order to manufacture a large-size micro LED display, an alternative method is demanded.

SUMMARY

One or more example embodiments provide a method of manufacturing a large-size micro LED display.

One or more example embodiments also provide a method of manufacturing a large-size micro LED display by using a roll-to-roll method.

One or more example embodiments also provide a method of manufacturing a large-size micro LED display by using a step and repeat the method.

One or more example embodiments also provide a method of manufacturing a large-size micro LED display by using a laser scanning method.

Additional aspects will be set forth in part in the description which follows and, in part, will be apparent from the description, or may be learned by practice of example embodiments.

According to an aspect of an example embodiment, there is provided a method of manufacturing a display, the method including a first operation of transferring a plurality of micro light emitting diodes (LEDs) to a plurality of wells of an interposer through a fluidic self assembly (FSA) process, a second operation of aligning a driving substrate on the interposer, a third operation of injecting a penetrating solvent between the interposer and the driving substrate, such that the penetrating solvent penetrates between the plurality of micro LEDs and the plurality of wells, and a fourth operation of transferring the plurality of micro LEDs to the driving substrate by radiating light to the interposer to vaporize the penetrating solvent.

The penetrating solvent may be a volatile liquid having an evaporation point of 100° C. or lower.

The penetrating solvent may include one or a combination of a plurality of liquids including water, alcohol, polyol, ketone, halocarbon, acetone, flux, and organic solvents.

The plurality of wells may have a depth of 0.5 to 1.5 times a thickness of the plurality of micro LEDs.

The light may be infrared light, and the light may be radiated based on a pulse width modulation (PWM) technique.

The fourth operation may further include fixing the plurality of micro LEDs to the driving substrate based on at least one of soldering, anisotropic conductive film (ACF), and attachment using a lead wire.

The second operation may further include aligning the driving substrate on the interposer based on align markers, and the align markers may be at least one of separate marks or pixel positions on the interposer and the driving substrate.

The method may further include, after the fourth operation, removing the penetrating solvent remaining on the interposer and the driving substrate.

The method may further include, after the fourth operation, cleaning surfaces of the interposer.

The first operation may further include supplying a suspension including the plurality of micro LEDs to the interposer, positioning the plurality of micro LEDs at the plurality of wells through at least one of a blade, a roller, or an absorbing member, and removing the suspension.

The plurality of micro LEDs may be supplied to the interposer based on at least one of a method of spraying the suspension including the plurality of micro LEDs onto the interposer, a dispensing method, an inkjet dot method, or a method of flowing the suspension to the interposer.

The positioning may include scanning at least one of the blade, the roller, or the absorbing member on the interposer, and the scanning may be performed through one or a combination of reciprocating motion, translational motion, rotational motion, rolling motion, rubbing motion, and spinning motion of at least one of the blade, the roller, or the absorbing member.

The suspension may include one or a combination of a plurality of liquids including water, alcohol, polyol, ketone, halocarbon, acetone, flux, and organic solvents.

The interposer may include a flexible material, the interposer may be recycled, and the first operation, the second operation, the third operation, and the fourth operation may be performed in a roll-to-roll process.

The driving substrate may include a first region to which micro LEDs among the plurality of micro LEDs are transferred and a second region to which a micro LED among the plurality of micro LEDs is not transferred, and the first operation, the second operation, the third operation, and the fourth operation may be performed on a portion of the second region by recycling the interposer.

The driving substrate may include electrode pads electrically connected to the plurality of micro LEDs and thin-film transistors (TFTs) electrically connected to the electrode pads.

The method may further include providing a passivation layer on the driving substrate to which the plurality of micro LEDs are transferred.

The method may further include providing a color conversion layer on the passivation layer.

According to another aspect of an example embodiment, there is provided a method of manufacturing a display, the method including a first operation of transferring a plurality of micro LEDs to a plurality of wells of an interposer through a fluidic self-assembly (FSA) process, the interposer including a blister layer in each of the plurality of wells, a second operation of aligning a driving substrate on the interposer, and a third operation of transferring the plurality of micro LEDs to the driving substrate by radiating a laser beam to the blister layer.

The driving substrate may include a first region to which micro LEDs among the plurality of micro LEDs are transferred and a second region to which a micro LED among the plurality of micro LEDs is not transferred, and the first operation, the second operation, and the third operation may be performed on a portion of the second region.

BRIEF DESCRIPTION OF THE DRAWINGS

The above and/or other aspects, features, and advantages of example embodiments will be more apparent from the following description taken in conjunction with the accompanying drawings, in which.

DETAILED DESCRIPTION

Figure 1:
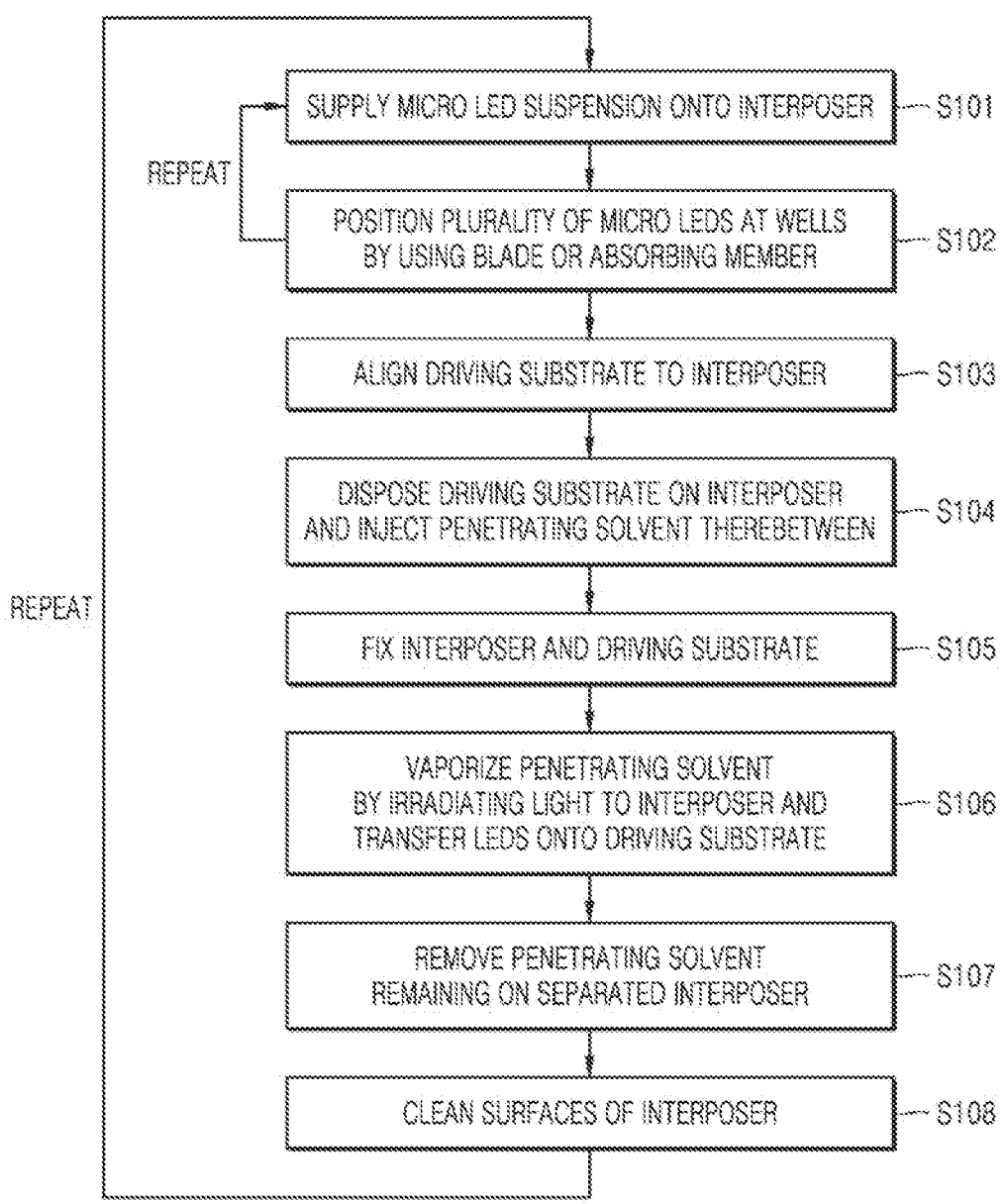
FIG. 1 is a flowchart showing a sequence of manufacturing a micro LED display according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, example embodiments will be described in detail with reference to the accompanying drawings. Meanwhile, the example embodiments described below are merely examples, and various modifications are possible from these embodiments. In the drawings, like reference numerals denote like elements, and the size and thickness of each element may be exaggerated for clarity of explanation.

Hereinafter, what is described as being "above" or "on" may include not only that which is directly above in contact, but also that which is above in a non-contact manner.

An expression used in the singular encompasses the expression of the plural, unless it has a clearly different meaning in the context. In addition, unless explicitly described to the contrary, the word "comprise" and variations such as "comprises" or "comprising" will be understood to imply the inclusion of stated elements but not the exclusion of any other elements.

The use of the terms "the" and similar indication words may refer to both singular and plural.

The meaning of "connection" may include a physical connection as well as an optical connection.

Furthermore, the use of all example terms (e.g., etc.) is merely intended to be illustrative of technical ideas and is not to be construed as limiting the scope of the term unless further limited by the claims.

While such terms as "first," "second," etc., may be used to describe various elements, such elements must not be limited to the above terms. The above terms are used only to distinguish one component from another.

Figure 2A:
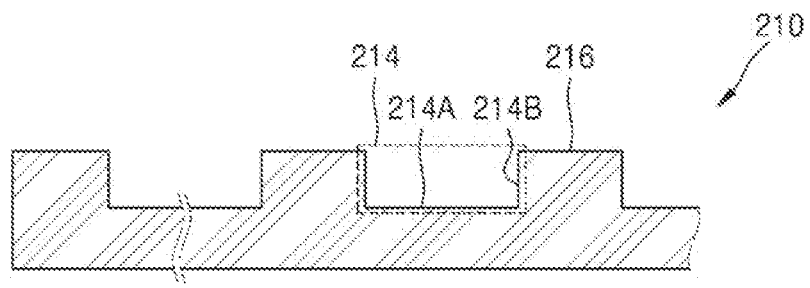
FIG. 2A is a cross-sectional view of an interposer.

FIG. 1 is a flowchart showing a sequence of manufacturing a micro LED display according to an example embodiment, FIG. 2A is a cross-sectional view of an interposer, and FIGS. 2B to 2F are diagrams showing respective operations of a method of manufacturing a micro LED display according to an example embodiment.

A method of manufacturing a micro LED display according to an example embodiment will be described with reference to FIGS. 1 and 2A to 2F.

A plurality of micro LEDs 220 are transferred to a plurality of wells 214 of an interposer 210 through a fluidic self-assembly (FSA) process (first operation). A transfer operation may include supplying a suspension L1 containing the plurality of micro LEDs 220 to the interposer 210 (operation S101), positioning the plurality of micro LEDs 220 at the plurality of wells 214 through at least one of a blade 230 or an absorbing member (operation S102), and an operation of removing the suspension L1.

The suspension L1 including a plurality of micro LEDs 220 is supplied onto the interposer 210 including a plurality of wells 214 (operation S101). A transparent interposer 210 including the plurality of wells 214 may be prepared. The interposer 210 may serve as a substrate on which the micro LEDs 220 are temporarily arranged before being transferred to a driving substrate 240. Although the interposer 210 is shown as a single layer, the interposer 210 may include multiple layers. The interposer 210 includes the plurality of wells 214, and the micro LEDs 220 may be arranged at the plurality of wells 214. The plurality of wells 214 may each have a size in which one micro LED 220 may be disposed or may have a size in which a plurality of micro LEDs 220 may be arranged. The plurality of wells 214 may have the same size, and the size may vary according to the size of the micro LED 220. The micro LED 220 may have a size of 1000 μm or less or may have a size of 200 μm or less. The size of the well 214 of the interposer 210 may be slightly larger than the size of one micro LED 220.

Referring to FIG. 2A, the interposer 210 may include the plurality of wells 214 and a substrate top surface 216 where the plurality of wells 214 are not formed on, and each well 214 may include a well bottom 214A and a well sidewall 214B. Although the well sidewall 214B is shown as a surface perpendicular to the well bottom 214A, embodiments are not limited thereto. For example, the well sidewall 214B may be an inclined surface. The interposer 210 may include a material having high light transmittance or a transparent material, such that light may pass therethrough. The well bottom 214A, the well sidewall 214B, and the substrate top surface 216 may include materials different from one another, and thus there may be surface energy differences.

A solvent of the suspension L1 may be any type of liquid as long as it does not cause corrosion in response to the micro LED 220 or the interposer 210 and is inert. The solvent of the suspension L1 may include, for example, one or a combination of a plurality of liquids including water, alcohol, polyol, ketone, halocarbon, acetone, flux, and organic solvents. The organic solvents may include, for example, isopropyl alcohol (IPA). However, usable liquids are not limited thereto, and various liquids may be used therein.

Instead of a pre-made micro LED suspension L1, the solvent of the suspension L1 may be first supplied onto the interposer 210, and then a plurality of micro LEDs 220 may be supplied onto the solvent of the suspension L1. According to another example embodiment, after supplying a plurality of micro LEDs 220 onto the interposer 210, the solvent of the suspension L1 may be supplied onto the interposer 210, wherein the processes may occur simultaneously.

A method of supplying the suspension L1 onto the interposer 210 may include various methods, e.g., a spray method, a dispensing method, an inkjet dot method, a method of flowing a liquid to the interposer 210, etc. An amount of the micro LED suspension L1 or the solvent of the suspension L1 may be variously adjusted to suit the depth of the well 214 or to be supplied more than the depth of the well 214.

Figure 2B:
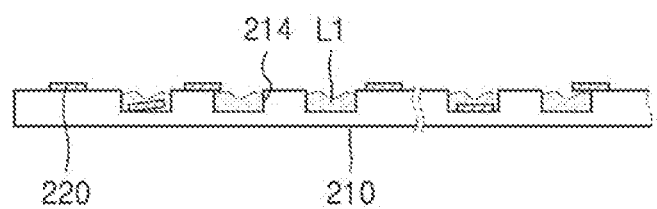
FIGS. 2B, 2C, 2D, 2E, and 2F are diagrams showing respective operations of a method of manufacturing a micro LED display according to an example embodiment.

Referring to FIG. 2B, the suspension L1 including a plurality of micro LEDs 220 may be supplied onto the interposer 210. Instead of a pre-made micro LED suspension L1, a plurality of micro LED 220 and the solvent of the suspension L1 may be supplied onto the interposer 210 separately or together. Before an FSA operation, the micro LED 220 may float on the suspension L1 on the interposer 210 or may be located on the substrate top surface 216 or in the wells 214.

Figure 2C:
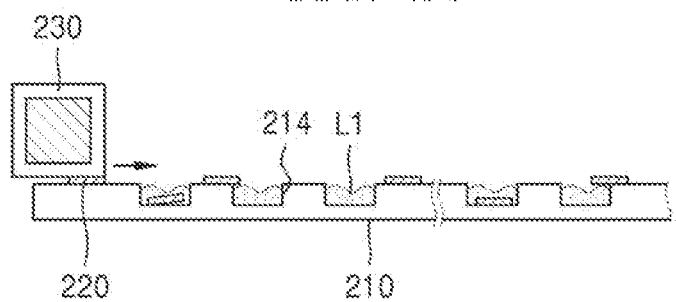

Referring to FIG. 2C, a plurality of micro LEDs 220 may be placed in the plurality of wells 214 by scanning the substrate top surface 216 by using the blade 230, a roller, or an absorbing member (operation S102). The scanning may be performed through various methods by using the blade 230, a roller, an absorbing member, etc. The blade 230 may scan the plurality of micro LEDs 220 supplied onto the interposer 210 and place them in the plurality of wells 214. The shape, the structure, or the material of the blade 230 is not particularly limited. The blade 230 may have contact with the interposer 210 and scan the plurality of micro LEDs 220 or may scan the plurality of micro LEDs 220 at a predetermined distance from the interposer 210. The predetermined distance may be equal to, smaller than, or greater than the thickness of the micro LED 220.

The absorbing member may locate the plurality of micro LEDs 220 into the plurality of wells 214 by scanning the plurality of micro LEDs 220 on the interposer 210 and may absorb the micro LED suspension L1 or the solvent of the suspension L1 on the plurality of wells 214 or the interposer 210 during the process. The shape or the structure of the absorbing member is not particularly limited as long as the absorbing member is capable of absorbing the micro LED suspension L1 or the solvent of the suspension L1. The absorbing member may include, for example, fabric, tissue, polyester fiber, paper, or a wiper. The absorbing member may have contact with the interposer 210 and scan the micro LEDs 220 or may scan the micro LED 220 at a predetermined distance from the interposer 210. The predetermined distance may be equal to, smaller than, or greater than the thickness of the micro LED 220. Also, instead of using an absorbing member only, both the blade 230 and the absorbing member may be used by adding the absorbing member to the blade 230.

The blade 230, the roller, or the absorbing member may be used alone without other mechanisms, but may also be coupled to a support to facilitate the FSA process. Such a support may have various shapes and structures facilitating an FSA process of the blade 230, roller, or absorbing member to the interposer 210.

In the scanning operation, the blade 230, the roller, or the absorbing member may move on the interposer 210 in a manner like sliding, rotating, translation, rolling, spinning, and/or rubbing. A movement as stated above may not only be performed once, but also be repeated a plurality of times, and the repetition may be regular or irregular. The above-stated process may also be performed on the interposer 210 while the blade 230, the roller, or the absorbing member is fixed and may also be performed through mutual movements between the interposer 210 and the blade 230, the roller, or the absorbing member. Also, an algorithm for recognizing wells 214 to which the micro LEDs 220 are not transferred and controlling the blade 230, the roller, or the absorbing member to scan over the wells 214 through an inner or outer system may be used. Such a recognition may be performed through the blade 230, the roller, the absorbing member, or a support to which the blade 230, the roller, or the absorbing member, are attached instead of the inner or outer system. A method of positioning the micro LEDs 220 is not limited to methods using the blade 230, the roller, or the absorbing member, and various methods, for example, pushing out a fluid by applying pressure on the fluid using a flat plate, may be used.

The micro LED 220 may include an electrode 222. A well bottom 214A, a well sidewall 214B, and the substrate top surface 216 of the interposer 210 may include different materials from one another. When materials constituting respective portions of the interposer 210 are different, a difference occurs between surface energy of the respective portions. Due to the difference between surface energy, the micro LED 220 including the electrode 222 may be transferred, such that a surface on which the electrode 222 is formed does not contact the well bottom 214A in a FSA operation.

Operations S101 and S102 above may be repeated when there is insufficient solvent of the suspension L1 or insufficient micro LEDs 20. For example, the micro LEDs 220 may be transferred to the plurality of wells 214 of the interposer 210 through repetition, respectively. When there are many micro LEDs 220 on the interposer 210 but the solvent of the suspension L1 is insufficient, only the solvent of the suspension L1 may be further supplied in operation S101. On the other hand, when there is sufficient solvent of the suspension L1 but there are insufficient micro LEDs 220, only the plurality of micro LEDs 220 may be further supplied in operation S101. After the scanning in operation S102 is finished, the micro LEDs 220 remaining on the interposer 210 without being transferred into the well 214 may be removed. Also, the solvent of the suspension L1 remaining on the interposer 210 may be removed. For example, the solvent of the suspension L1 may be removed through vaporization or blowing. When the solvent of the suspension L1 is not removed, the micro LEDs 220 transferred into the wells 214 may escape out of the well 214. For example, the micro LEDs 220 floating by solvent of the suspension L1 inside the well may be transferred to the interposer 210 by removing the solvent of the suspension L1.

The driving substrate 240 is aligned, disposed and/or fixed onto the interposer 210 (operation S103) (second operation). The driving substrate 240 may be a substrate onto which the plurality of micro LEDs 220 are finally transferred. The driving substrate 240 may include a partitioning wall 242, a thin-film transistor (TFT) 246, and an electrode pad 248 electrically connecting the micro LED 220 and the TFT 246. Also, a portion of the driving substrate 240 surrounded by the partitioning wall 242 may form a groove 244, and the groove 244 may correspond to the well 214 of the interposer 210. The substrate top surface 216 of the interposer 210 and a surface of the driving substrate 240 having formed thereon the partitioning wall 242 may contact each other. When the interposer 210 and the driving substrate 240 overlap each other, an empty space may be formed by the well 214 of the interposer 210 and the groove 244 of the driving substrate 240, and a penetrating solvent L2 may be injected into the empty space.

The interposer 210 and the driving substrate 240 may be aligned by using align markers AM. An aligning operation may include fixing the interposer 210 and the driving substrate 240. Separate align markers AM may be marked on the interposer 210 and the driving substrate 240, and the substrate top surface 216 of the interposer and the partitioning wall 242 of the driving substrate 240 may be aligned to face each other through the align markers AM. Two or more align markers AM may be marked on each of the interposer 210 and the driving substrate 240. The align markers AM are not limited to separate markers, and pixel positions, that is, the well 214 of the interposer and the groove 244 of the driving substrate corresponding thereto may be the align markers AM. After the driving substrate 240 and the interposer 210 are aligned through the groove 244 of the driving substrate and the well 214 of the interposer as the align markers AM, the interposer 210 and the driving substrate 240 may be fixed. Since the size of the align marker AM, the groove 244, or the well 214 is in μm scale, alignment and fixation may be performed by checking the alignment through a microscope M. However, embodiments are not limited thereto, and the driving substrate 240 and/or the interposer 210 may be inserted into a frame and alignment and fixation may be performed without the aid of the microscope M. The fixing operation may be performed after the alignment operation, wherein a penetrating solvent L2 may be injected before the alignment operation.

The penetrating solvent L2 is injected between the interposer 210 and the driving substrate 240, such that the penetrating solvent L2 penetrates between the plurality of micro LEDs 220 and the plurality of wells 214 (operation S104) (third operation).

The penetrating solvent L2 may penetrate between the micro LEDs 220 and the well bottom 214A and partially or completely separate the micro LEDs 220 from the well bottom 214A.

The penetrating solvent L2 may include, for example, one or a combination of a plurality of liquids including water, alcohol, polyol, ketone, halocarbon, acetone, flux, and organic solvents. The organic solvents may include, for example, isopropyl alcohol (IPA). However, usable liquids are not limited thereto, and various liquids may be used therein. The penetrating solvent L2 may be a highly volatile liquid and may easily penetrate between the micro LEDs 220 and the well bottom 214A. The penetrating solvent L2 may not corrode by reactions with the interposer 210, the driving substrate 240, and the micro LED 220 and may be inert. The penetrating solvent L2 may be a solvent that may easily penetrate into a joint space between the micro LEDs 220 and the well bottom 214A and may be easily removed after a process. Also, the penetrating solvent L2 may need a small amount of energy for vaporization and may have a low evaporation temperature to avoid damage to the interposer 210 or the driving substrate 240. For example, the penetrating solvent L2 may have an evaporation point of 100° C. or lower. The penetrating solvent L2 may be the same material as the solvent of the micro LED suspension L1 or may be a different material. For example, the solvent of the micro LED suspension L1 may be water, and the penetrating solvent L2 may be acetone or ethanol.

Figure 2D:
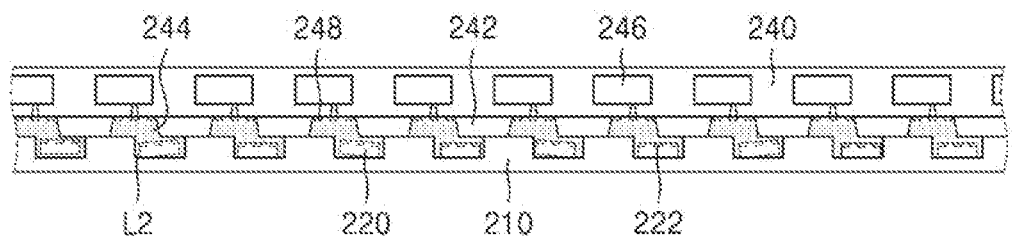

FIG. 2D is a diagram showing injection of the penetrating solvent L2 between the interposer 210 and the driving substrates 240 before the interposer 210 is aligned on the driving substrate 240. Referring to FIG. 2D, operation S104 of injecting the penetrating solvent L2 may include an operation of injecting the penetrating solvent L2 between the interposer 210 and the driving substrate 240 and an operation of separating the micro LEDs 220 from the well bottom 214A. Since there is an empty space on a surface where the driving substrate 240 and the interposer 210 contact each other, the penetrating solvent L2 may be injected into the empty space. The penetrating solvent L2 is injected into the empty space and penetrates between the micro LEDs 220 and the well bottom 214A, thereby partially or entirely separating the micro LED 220s from the well bottom 214A.

The penetrating solvent L2 may be injected (operation S104) after the driving substrate 240 is aligned on the interposer 210 (operation S103). According to another example embodiment, the driving substrate 240 may be aligned on the interposer 210 (operation S103) after the penetrating solvent L2 is injected (operation S104). When the penetrating solvent L2 is injected first, the driving substrate 240 may be arranged in advance, such that a gap between the interposer 210 and the driving substrate 240 is smaller than the thickness of the micro LEDs 220 to prevent the micro LEDs 220 from being separated from the wells 214.

The interposer 210 and the driving substrate 240 are fixed (operation S103). The interposer 210 and the driving substrate 240 may be fixed after being aligned. The penetrating solvent L2 may be injected and the interposer 210 and the driving substrate 240 may be fixed after the interposer 210 and the driving substrates 240 are aligned. According to another example embodiment, the interposer 210 and the driving substrate 240 may be aligned and fixed after the penetrating solvent L2 is injected. Since the size of the align marker AM, the groove 244, or the well 214 is in µm scale, fixation may be performed by checking the alignment through a microscope M. To this end, the interposer 210 may include a transparent material. Fixation of the interposer 210 and the driving substrate 240 may be sufficient as long as there is no gap therebetween. For example, the interposer 210 and the driving substrate 240 may apply pressure to each other to prevent distortion of alignment.

Figure 2E:
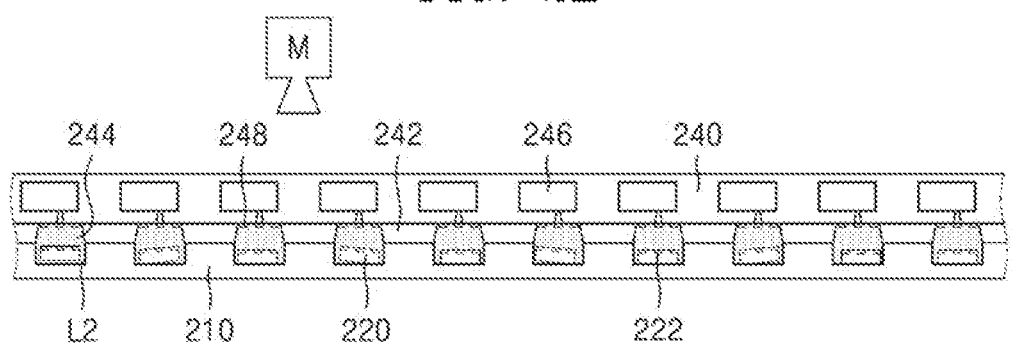

FIG. 2E is a diagram showing alignment and fixation of the interposer 210 and the driving substrates 240. Two or more marks may be made on the interposer 210 and the driving substrate 240, or pixel positions, that is, the wells 214 of the interposer 210 and the groove 244 of the driving substrate 240 may be used as the align markers AM. In the latter case, the partitioning wall 242 of the driving substrate 240 may be brought into contact with the substrate top surface 216 of the interposer 210.

Figure 2F:
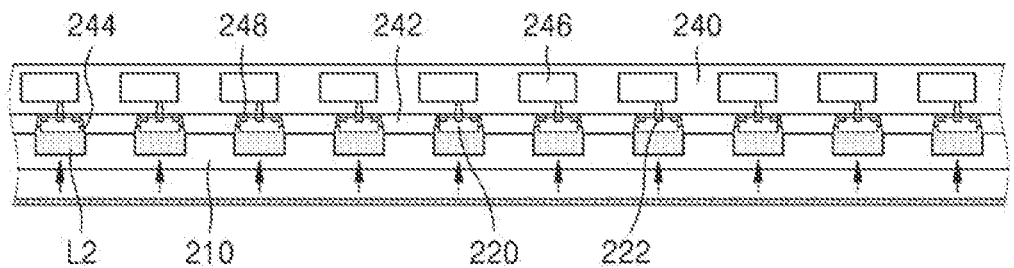

The penetrating solvent L2 is vaporized by radiating light onto the interposer 210, thereby transferring the plurality of micro LEDs 220 onto the driving substrate 240 (operation S105) (fourth operation). The interposer 210 may have a high transmittance to light or may be transparent to allow light to pass therethrough. Light may be radiated through a light lamp, wherein the light lamp may radiate IR light. For example, a Xe lamp may be used as the light lamp. In this case, the interposer 210 may include a material having high transmittance to IR light. Referring to FIG. 2F, the light lamp may radiate light onto the entire surface of the interposer 210 opposite to the surface having formed thereon the wells 214, and the penetrating solvent L2 penetrating between the micro LEDs 220 and the well bottom 214A is heated and vaporized in operation S105. As the penetrating solvent L2 is vaporized, the micro LEDs 220 are pushed out of the wells 214 and are transferred to the groove 244 of the driving substrate 240.

Light may be radiated in various ways. To minimize conduction of heat due to the penetrating solvent L2, light may be radiated by a pulse width modulation (PWM) technique. According to the PWM technique, light is radiated through fast ON/OFF voltage application through a switch instead of continuous voltage application, thereby vaporizing only the penetrating solvent L2 penetrating between the well bottom 214A and the micro LEDs 220. Therefore, damage to devices and systems may be prevented or reduced. By radiating light according to the PWM technique, heat conduction to the driving substrate 240 and interposer 210 may be minimized, and thus the micro LEDs 220 may be transferred by vaporizing only the penetrating solvent L2 and damage and deformation of the interposer 210 and the driving substrate 240 may be prevented or reduced. For example, unlike related art in which only well portions of a substrate are selectively optically scanned, in a method of manufacturing a display according to an example embodiment, by optically scanning an entire surface, the micro LEDs 220 may be transferred to a large driving substrate 240 at a high speed.

As the penetrating solvent L2 is vaporized, the micro LEDs 220 may be pushed toward the groove 244 of the driving substrate 240 and contact the driving substrate 240. At this time, since the size of the micro LEDs 220 is in µm scale, the micro LEDs 220 may be firmly attached to the electrode pad 248 by the van der Waals force. The micro LEDs 220 and the electrode pad 248 may be temporarily fixed to each other through a soldering, an anisotropic conduction film (ACF), or a wire connecting electrodes formed therebetween in advance, and then the micro LEDs 220 and the electrode pad 248 may be electrically connected to each other through a method such as an entire surface heat compression. For example, in the case of the soldering, the micro LEDs 220 may be fixed to the driving substrate 240 by applying heat to a solder paste previously patterned on the electrode 222 and the electrode pad 248 at a temperature of 250° C. or less. In the case of the ACF which uses fine conductive beads, when heat and pressure are applied between the micro LEDs 220 and the driving substrate 240, the fine conductive beads between the electrode 222 and the electrode pad 248 are crushed, thereby attaching and electrically connecting the electrode 222 and the electrode pad 248 to each other.

When the micro LEDs 220 including electrodes 222 are respectively transferred into the wells 214 of the interposer 210, the micro LEDs 220 may be transferred, such that the electrodes 222 of micro LEDs 220 do not contact the well bottom 214A. When the micro LEDs 220 are transferred onto the driving substrate 240, the electrodes 222 of the micro LEDs 220 may be fixed in a direction toward the groove 244 of the driving substrate 240. For example, when the driving substrate 240 is turned upside down such that the partitioning wall 242 of the driving substrate 240 faces upward, the electrodes 222 of the micro LEDs 220 may be located at the bottom of the groove 244.

The electrodes 222 of the micro LED 220 may include a first electrode and a second electrode spaced apart from each other, the first electrode may be an anode, and the second electrode may be a cathode. For example, the micro LED 220 may have a horizontal electrode structure in which two electrodes spaced apart from each other are located at the bottom when the micro LED 220 is transferred through the above-stated operations. According to another example embodiment, the electrode 222 of the micro LED 220 may be a lower electrode, and, after the micro LED 220 is transferred, an upper electrode may be formed on a side opposite to the lower electrode 222. For example, the micro LED 220 may have a vertical electrode structure in which two electrodes spaced apart from each other are respectively located at the lower portion and the upper portion when transferred through the above-stated operations.

After the micro LEDs 220 are transferred to the driving substrate 240, the interposer 210 may be separated from the driving substrate 240 (operation S106), and the separated interposer 210 may be recycled and operations S101 to S105 may be repeated. The recycled interposer 210 may be used to transfer the micro LEDs 220 to a new driving substrate 240 or transfer the micro LEDs 220 to a portion of the driving substrate 240 where the micro LEDs 220 are not transferred. Before operation S101 is started, the penetrating solvent L2 remaining in the separated interposer 210 may be removed (operation S107) by using, for example, a method like vaporization or blowing. Thereafter, the surface of the separated interposer 210 may be cleaned (operation S108). Operation S107 of removing the penetrating solvent L2 may be included in operation S108 of cleaning the surface of the separated interposer 210. When the interposer 210 is not recycled, operations S107 and S108 may be omitted. The recycled interposer 210 will be described later with reference to FIGS. 9 to 11.

Next, a method of manufacturing a micro LED display will be described in more detail.

Referring back to FIG. 2A, the interposer 210 according to an example embodiment may be a single body or a single molded substrate including the plurality of wells 214. The interposer 210 may include, for example, an organic material, an inorganic material, or a metal, e.g., silicon, glass, sapphire, a polymer, etc., and may be manufactured through a process like photoresist, patterning, etching, molding, etc. However, embodiments are not limited thereto. The interposer 210 may include a material having high light transmittance. For example, the interposer 210 may include a transparent material for an alignment process and may also include a material having high transmittance to infrared light for optical scanning. The interposer 210 may include a flexible roll film or the like. The wells 214 may serve to guide the transfer of micro LEDs when the micro LEDs are transferred to a driving substrate. The interposer 210 may include the plurality of wells 214 and an substrate top surface 216 where the plurality of wells 214 are not formed on, and each well 214 may include the well bottom 214A and the well sidewall 214B.

The well 214 may have a cross-sectional area larger than a surface cross-sectional area of a micro LED, such that the micro LED may be transferred thereto. The well 214 may have an area to which one micro LED may be transferred or an area to which a plurality of micro LEDs may be transferred. The well 214 may have a shape similar to the cross-sectional shape of the micro LED but may be larger than the cross-section of the micro LED. According to another example embodiment, the well 214 may have a shape different from the cross-sectional shape of the micro LED to facilitate transfer in any direction. For example, the well 214 may have a polygonal shape, an elliptical shape, or a circular shape. The depth of the well 214 may be smaller or greater than the thickness of the micro LED. For example, the depth of the well 214 may have a depth that is from 0.4 to 2 times the thickness of the micro LED. However, the depth of the well 214 may be deep enough such that the micro LEDs do not protrude out of the well 214 when the micro LEDs are partially or entirely separated from the well bottom 214A by the penetrating solvent L2. Also, the depth of the well 214 may not be too deep compared to the thickness of the micro LEDs to facilitate transfer when the micro LEDs are transferred to the driving substrate due to vaporization of the penetrating solvent L2. The well 214 may have a depth from 0.5 to 1.5 times the thickness of the micro LEDs.

Figure 3A:
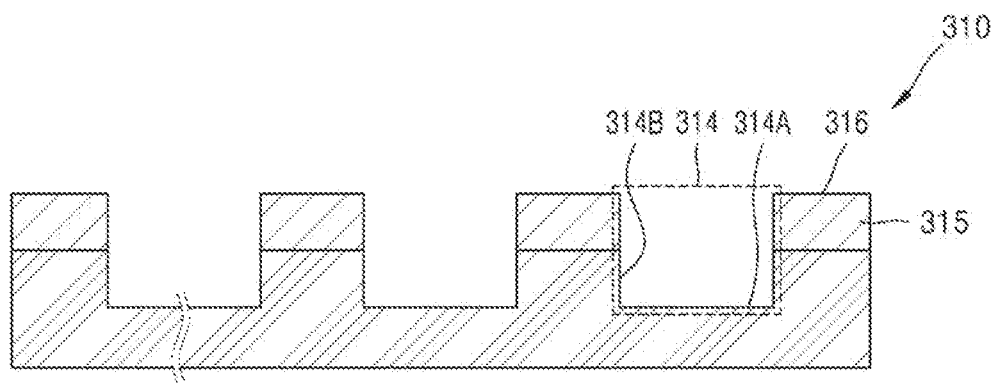
FIG. 3A is a diagram showing that an interposer further includes a metal layer.
Figure 3B:
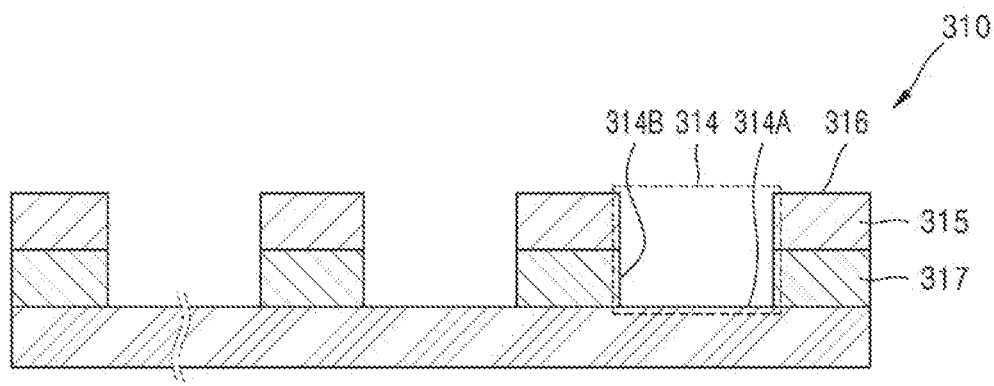
FIG. 3B is a diagram showing that an interposer further includes molds.

FIG. 3A is a diagram showing that an interposer further includes a metal layer, and FIG. 3B is a diagram showing that an interposer further includes molds.

Referring to FIG. 3A, an interposer 310 according to an example embodiment may further include a metal layer 315 on an interposer top surface 316. The metal layer 315 may include silver (Ag), gold (Au), platinum (Pt), nickel (Ni), chromium (Cr), and/or aluminum (Al) and may have a surface energy different from that of a well bottom 314A of the interposer 310. This difference in surface energy causes electrodes to be positioned at the top when a micro LED including the electrodes is transferred to the well 314, and thus, when the micro LED is finally transferred to a driving substrate 340, a horizontal electrode structure in which two electrodes are positioned at the groove bottom or a vertical electrode structure may be obtained. Electrodes being positioned on the top may mean that the micro LED is transferred, such that the electrodes do not contact the well bottom 314A.

Referring to FIG. 3B, the interposer 310 according to an example embodiment may further include molds 317 on an interposer body 312. Also, the metal layer 315 may be further included on the molds 317. Accordingly, the interposer body 312 may correspond to the well bottom 314A, the molds 317 may correspond to a well sidewall 314B, and the metal layer 315 may correspond to the interposer top surface 316, wherein the well bottom 314A, the well sidewall 314B, and the interposer top surface 316 may include the same material or different materials. When the well bottom 314A, the well sidewall 314B, and the interposer top surface 316 include different materials, surface energy thereof may differ from one another as described above, and such differences in surface energy may cause electrodes to be positioned at the top when a micro LED is transferred to the well 314 as described above. Electrodes being positioned on the top may mean that the micro LED is transferred to a surface on which the electrodes do not contact the well bottom 314A.

Next, an example of operations S101 and S102 of transferring a micro LED to an interposer through a FSA process will be described.

Figure 4:
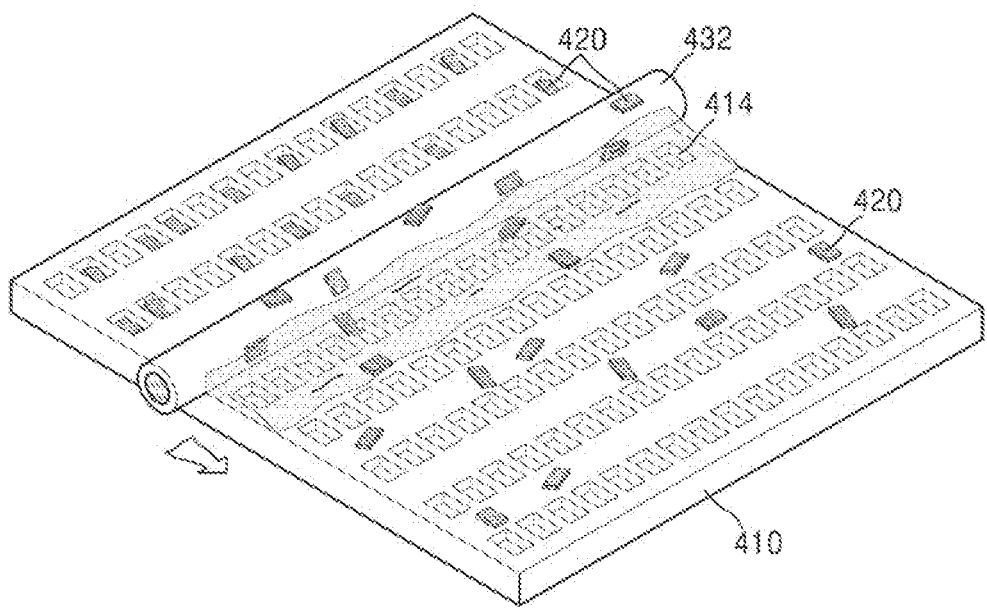
FIG. 4 is a conceptual diagram showing fluidic self-assembly using an absorbing member.

FIG. 4 is a conceptual diagram showing fluidic self-assembly using an absorbing member.

Referring to FIG. 4, micro LEDs 420 may be transferred by scanning an interposer 410, to which the micro LED suspension L1 is supplied, by using an absorbing member 432. Here, since the absorbing member 432 is capable of absorbing the solvent of the micro LED suspension L1, the micro LEDs 420 may be prevented from being separated from the interposer 410. Since the absorbing member 432 is capable of absorbing the solvent of the suspension L1, the micro LEDs 420 may be transferred to the interposer 410 by supplying the solvent of the suspension L1 or the micro LED suspension L1 to the absorbing member 432 in advance. Even in this case, a predetermined number of micro LEDs 420 may be transferred to each of a plurality of wells 414 by repeating operations S101 and S102 for a plurality of number of times. When above operations S101 and S102 are completed, the solvent of the suspension L1 not removed through the absorbing member 432 may be removed through vaporization or blowing.

Next, an example of operation S103 of aligning, disposing, and/or fixing an interposer and a driving substrate by using align markers will be described.

Figure 5A:
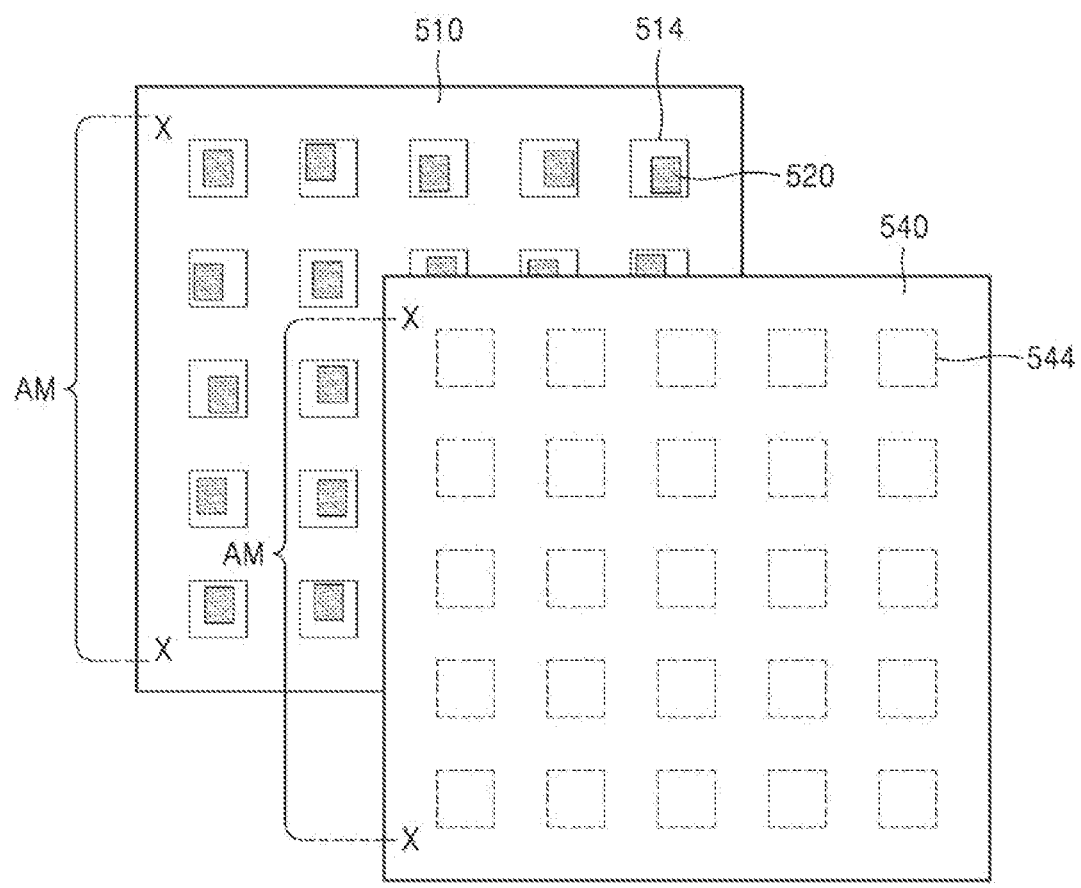
FIG. 5A is a diagram showing alignment by forming a separate align marker.
Figure 5B:
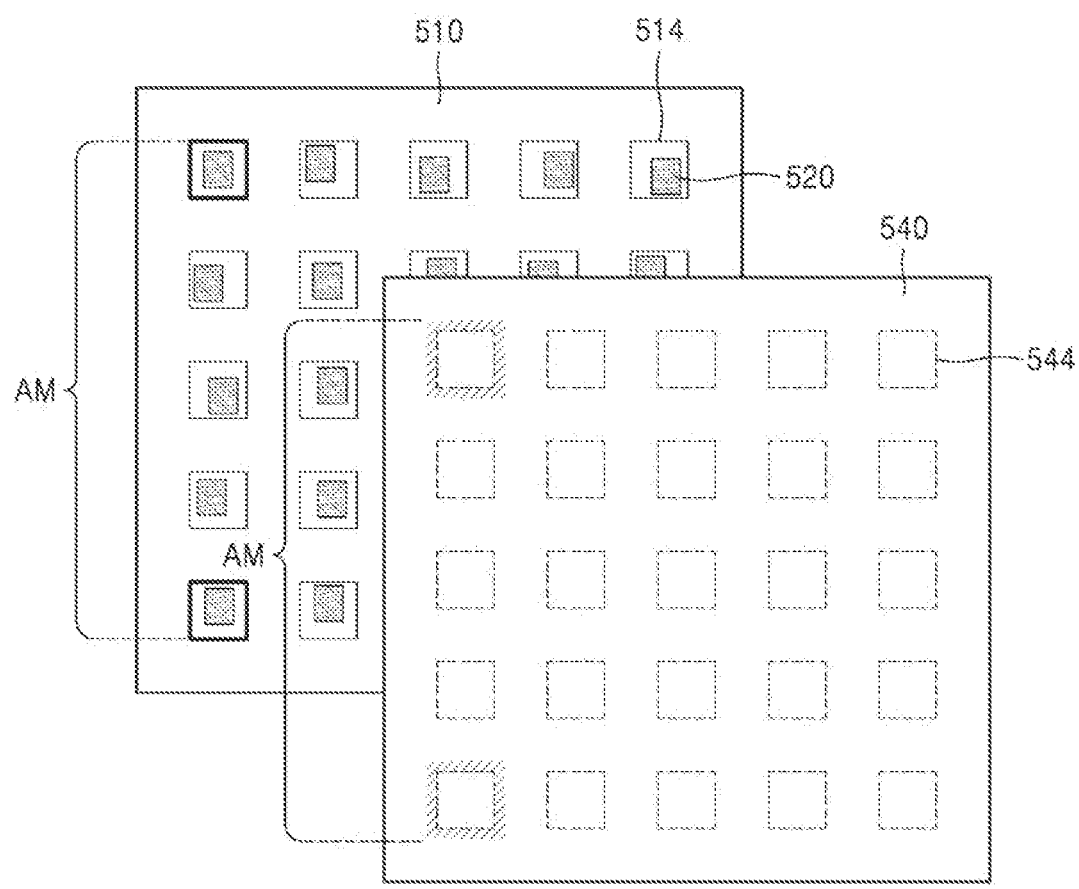
FIG. 5B is a diagram showing alignment using pixels as align markers.

FIG. 5A is a diagram showing alignment by marking separate align markers AM, and FIG. 5B is a diagram showing alignment using pixels as align markers.

Referring to FIG. 5A, align markers AM may be marked on an interposer 510 and a driving substrate 540, respectively. The align markers AM may be marked on portions other than pixel positions. When the interposer 510 and the driving substrate 540 correspond to each other on one-on-one basis, at least two align markers AM may be marked. When the driving substrate 540 is larger than the interposer 510 and transfers using the interposer 510 are performed for a plurality of number of times on the driving substrate 540, align markers AM corresponding to respective positions at which the interposer 510 is aligned may be marked on the driving substrate 540. The interposer 510 may include a transparent material, and the interposer 510 may be placed to overlap corresponding align markers AM of the driving substrate 540 by using the microscope M over the interposer 510. When the interposer 510 overlaps all of marked align markers AM, the interposer 510 and the driving substrate 540 are aligned. In the aligned state, a partitioning wall of the driving substrate 540 and the substrate top surface of the interposer 510 may face each other across a gap or may contact each other. In the aligned state, the interposer 510 and the driving substrate 540 may be temporarily fixed. Fixation may be performed after the penetrating solvent L2 is injected. The fixation may be performed by using various methods. However, since the interposer 510 and the driving substrate 540 are separated after transfer, a method for fixation may be temporary.

Referring to FIG. 5B, a groove 544 of the driving substrate and a well 514 of the interposer may serve as the align markers AM. At least two grooves 544 and at least two wells 514 corresponding to each other may be designated. When the driving substrate 540 is larger than the interposer 510 and transfers using the interposer 510 are performed for a plurality of number of times on the driving substrate 540, pixel positions of the driving substrate 540, that is, the grooves 544 and the wells 514 corresponding to respective positions at which the interposer 510 is aligned may serve as the align markers AM. The align markers AM marked in advance may be brought to overlap positions of each other by using the microscope M or the like.

Next, an example of operation S104 of injecting the penetrating solvent L2 will be described.

Before the alignment operation (operation S103) is performed, a penetrating solvent may be injected (operation S104). In the unaligned state, a driving substrate may be pre-positioned on an interposer. The driving substrate includes a partitioning wall and a groove surrounded by the partitioning wall. When the positions of the groove and a well do not match, for example, when a substrate top surface of the interposer and the partitioning wall are not in contact, the penetrating solvent L2 may be injected between the interposer and the driving substrate. In order to inject the penetrating solvent L2 in the aligned state, the penetrating solvent L2 may be injected while moving the interposer and the driving substrate relatively. When the penetrating solvent L2 is injected between the interposer and the driving substrate, the penetrating solvent L2 may penetrate the contact surface between a micro LED and a well bottom, and the micro LED and the well bottom may be partially or completely separated from each other.

Figure 6:
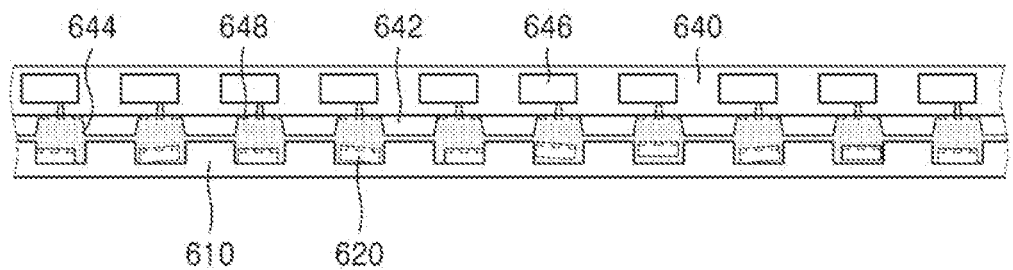
FIG. 6 is a cross-sectional view showing injection of a penetrating solvent after performing an alignment process.

FIG. 6 is a cross-sectional view showing injection of a penetrating solvent (operation S104) after performing the alignment operation (operation S103).

Referring to FIG. 6, after a driving substrate 640 and an interposer 610 are aligned with each other, the penetrating solvent L2 may be injected into a well 614 of the interposer 610. The driving substrate 640 may be disposed close to the interposer 610 in advance to prevent a micro LED 620 from being separated from the well 614 of the interposer 610. In this case, a distance between a partitioning wall 642 and a substrate top surface 616 may be smaller than the thickness of the micro LED 620. After the penetrating solvent L2 is injected, the interposer 610 and the driving substrates 640 may contact each other and be fixed.

Next, an example of operation S105 of transferring a micro LED to a driving substrate by irradiating light will be described.

The interposer 210 may include a material having high light transmittance or a transparent material to facilitate light transmittance therethrough. Referring back to FIG. 2F, light may be radiated from a surface facing the surface of the interposer 210 having formed thereon the well 214 toward the surface of the interposer 210 having formed thereon the well 214, thereby vaporizing the penetrating solvent L2 partially or completely penetrating between the well bottom 214A and the micro LED 220. As the penetrating solvent L2 is vaporized, the micro LED 220 may be pushed out from the well 214 of the interposer and transferred to the groove 244 of the driving substrate 240.

A light lamp 250 radiating light may radiate infrared light. However, a light source is not limited to the light lamp 250, and light may be radiated through various methods. For example, a Xe lamp may be used as the light lamp 250 and may be operated according to a PWM technique. When light is radiated according to the PWM technique, only the penetrating solvent L2 may be vaporized before heat generated by the penetrating solvent L2 is conducted to the interposer 210 or the driving substrate 240 around the penetrating solvent L2, and thus damage to the interposer 210 and the driving substrate 240 may be reduced or prevented. Also, light may be radiated to the entire surface of the interposer 210 according to the PWM technique, and thus a transfer speed is fast and suitable for manufacturing a large-size display as compared to selective radiation of light only to the plurality of wells 214. However, the present disclosure is not limited to the light radiation onto the entire surface, and light may be radiated to the penetrating solvent L2 under the respective micro LEDs 220 through light sources arranged in correspondence to the plurality of wells 214. When light is radiated only to the wells 214, heat conduction may be minimized, and thus damage to the interposer 210 and the driving substrate 240 may be minimized.

As the penetrating solvent L2 penetrating between the micro LEDs 220 and the well bottom 214A is vaporized, the micro LEDs 220 are transferred to the groove 244 of the driving substrate 240. Thereafter, a process like soldering, ACF, or attachment using a lead wire may be used to fix the micro LEDs 220 to the driving substrate 240.

The driving substrate 240 may be separated from the interposer 210 (operation S106) after the transfer operation (operation S105), and the penetrating solvent L2 remaining on the driving substrate 240 may be removed (operation S107). The penetrating solvent L2 remaining on the driving substrate 240 may be removed by using a method such as, for example, heating or blowing and may also be removed by using various methods capable of removing the penetrating solvent L2. When the penetrating solvent L2 having a low evaporation point is used, the penetrating solvent L2 may be more easily removed during heating, and damage to the driving substrate 240 may be reduced or minimized.

Figure 7:
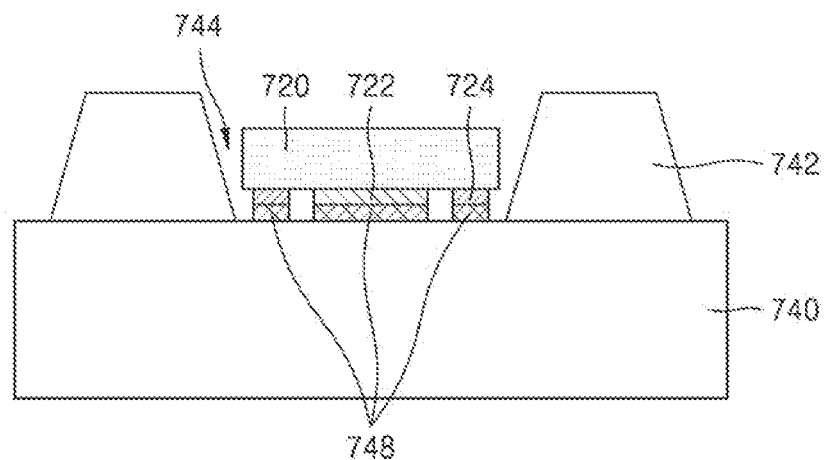
FIG. 7 is a diagram showing that a micro LED having a vertical electrode structure is electrically connected to an electrode pad of a driving substrate.
Figure 8:
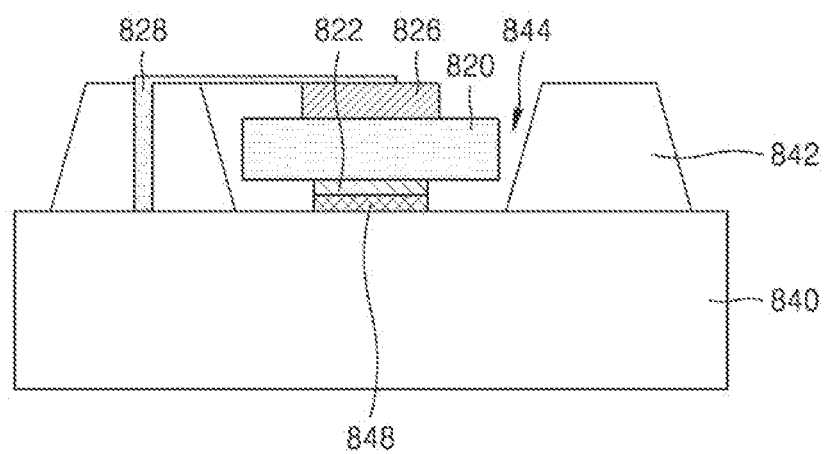
FIG. 8 is a diagram showing that a micro LED having a horizontal electrode structure is electrically connected to an electrode pad of a driving substrate.

FIG. 7 is a diagram showing that a micro LED 720 having a horizontal electrode structure that is electrically connected to an electrode pad 748 of a driving substrate 740, and FIG. 8 is a diagram showing that a micro LED 820 having a vertical electrode structure that is electrically connected to an electrode pad 848 of a driving substrate 840.

Referring to FIG. 7, after the penetrating solvent L2 is removed, the micro LED 720 may be electrically connected to the electrode pad 748 of the driving substrate 740. The micro LED 720 may have a horizontal electrode structure. When the micro LED 720 is transferred to the driving substrate 740, the micro LED 720 may be turned upside down around the driving substrate 740. Therefore, when a first electrode 722 and a second electrode 724 are positioned at the top when the micro LED 720 is transferred to an interposer, in the micro LED 720 of the driving substrate 740 after the transfer, the first electrode 722 and the second electrode 724 may be positioned at the bottom. For example, by using the interposer, the micro LED 720 may have a horizontal electrode structure in which two electrodes 722 and 724 are located at the bottom. When the micro LED 720 has a horizontal electrode structure in which the two electrodes 722 and 724 are positioned at the bottom, it is not necessary to extend a separate electrode or a wire to the top or a side of the micro LED 720, and electrodes may be more easily arranged during a LED display manufacturing process. Therefore, production efficiency may be improved.

Also, referring to FIG. 8, when one electrode 822 of an anode or a cathode is positioned on the top of an interposer when the micro LED 820 is transferred to the interposer, an electrode 826 may be formed on a surface on which an electrode of the micro LED 820 is not placed, and the electrode 826 may have a polarity opposite to that of the previously formed electrode 822. The electrode 822 positioned at the bottom of the micro LED 820 having a vertical electrode structure may be electrically connected to the electrode pad 848 and the electrode 826 positioned at the top may be electrically connected through a separate extension line 828.

Furthermore, electrical connections of micro LEDs 720 and 820 having a horizontal electrode structure or a vertical electrode structure may be performed through various methods. After an electrical connection is established, the micro LED 720 or 820 may be fixed to a transferred position through various methods. For example, an insulation layer may be patterned on the driving substrate 840 for fixing and electrically insulating the micro LED 820.

Next, repeatedly performing operations S101 to S106 by recycling an interposer will be described.

Figure 9:
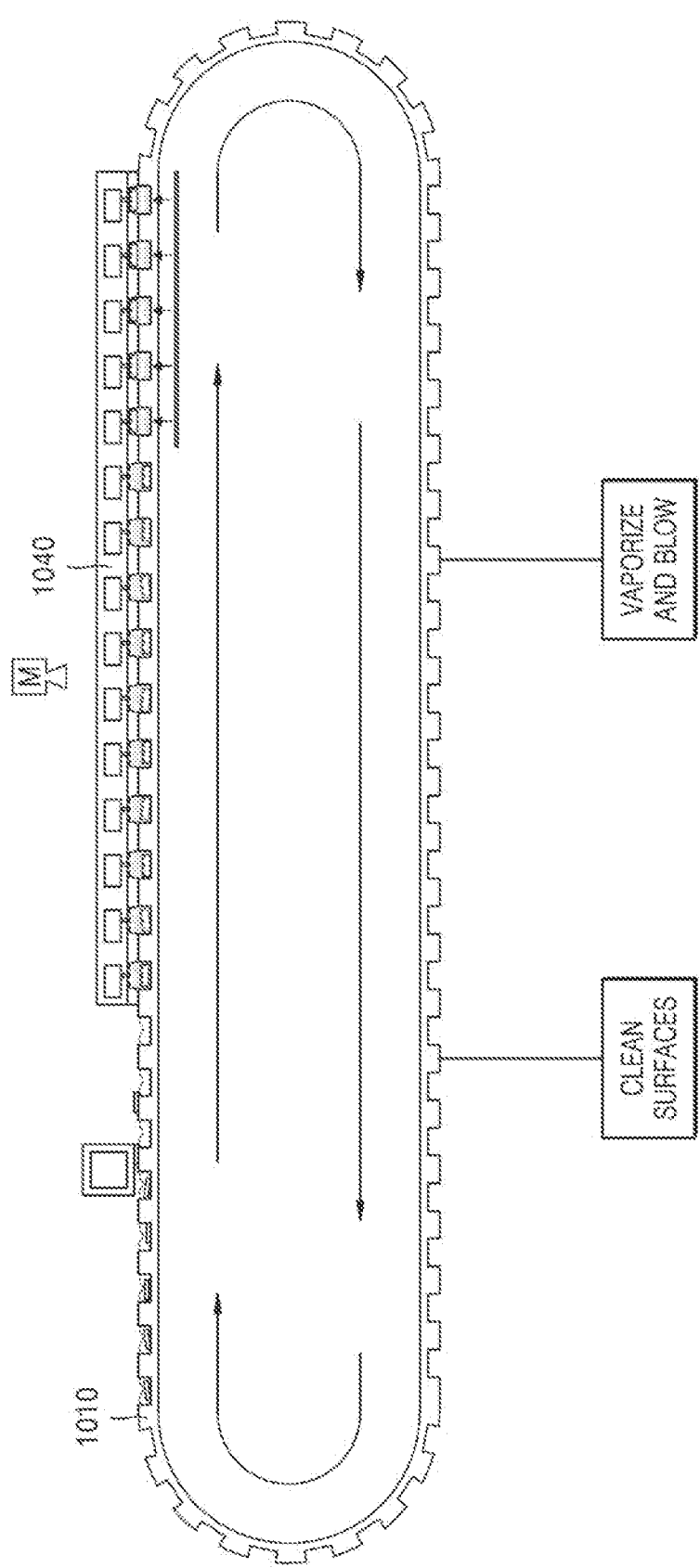
FIG. 9 is a diagram showing that a separated interposer is recycled in a roll-to-roll process after a micro LED is transferred to a driving substrate.
Figure 10:
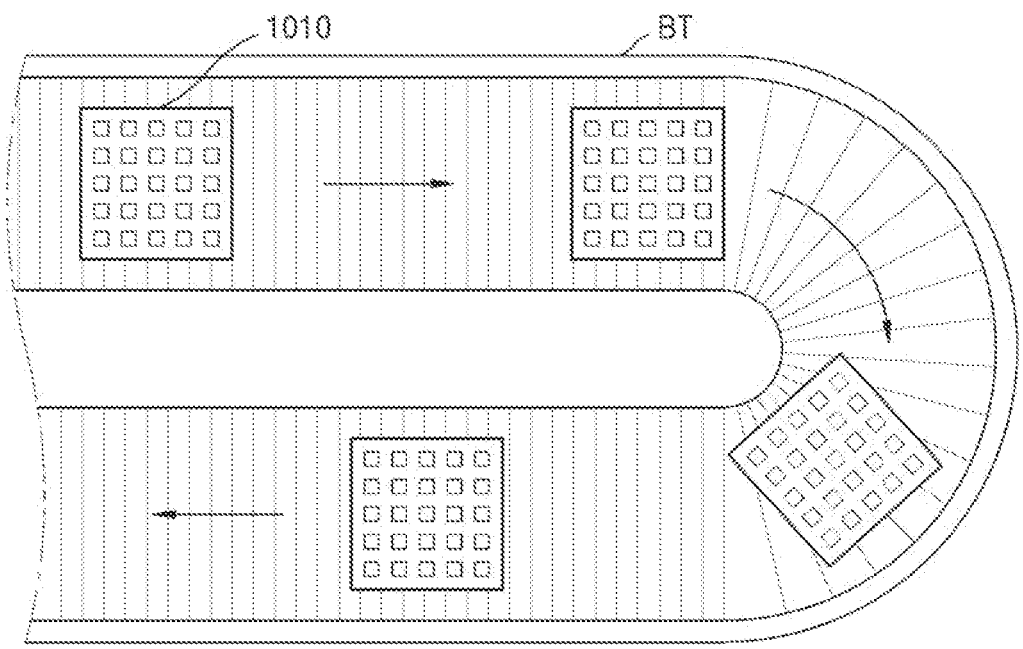
FIG. 10 is a diagram showing an interposer being recycled on a belt.
Figure 11:
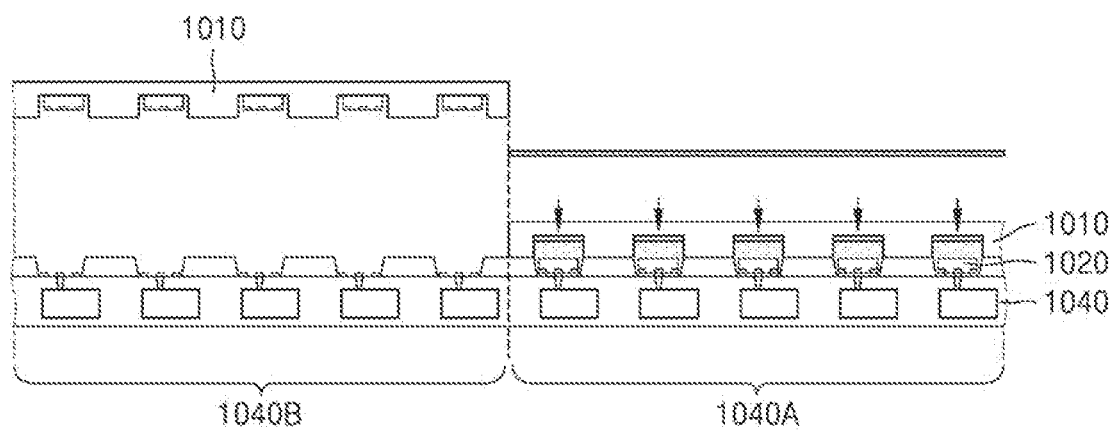
FIG. 11 is a diagram showing that a separated interposer is recycled in a step-and-repeat process.

FIG. 9 is a diagram showing that a separated interposer is recycled in a roll-to-roll process after a micro LED is transferred to a driving substrate, FIG. 10 is a diagram showing an interposer being recycled on a belt BT, and FIG. 11 is a diagram showing that a separated interposer is recycled in a step-and-repeat process.

Referring to FIGS. 9, 10 and 11, after a micro LED is transferred to a driving substrate, a separated interposer 1010 may be recycled and a process to the transferring to a first substrate 1040 may be repeated. The first substrate 1040 may be the same substrate as the driving substrate, and the first substrate may be a new driving substrate to which a micro LED is not transferred. In this case, the interposer 1010 may be the same size as the first substrate 1040, or may have a larger size or a smaller size than the first substrate 1040.

As shown in FIG. 9, when the interposer 1010 according to an example embodiment includes a flexible material, the interposer 1010 may be repeatedly used in a manufacturing process through a roll-to-roll process or web processing. The interposer 1010 may be disposed on a roller or a disk, and thus the roll-to-roll process may be repeated. Operations S101 to S106 may proceed depending on a direction in which the interposer 1010 proceeds, and, after the interposer 1010 and a driving substrate are separated, an operations of removing the penetrating solvent L2 (operation S107) and an operation of cleaning a surface of the interposer 1010 (operation S108) may be performed before the interposer 1010 reaches a position at which operation S101 is performed. The roll-to-roll process may be appropriate when the interposer 1010 is larger than the first substrate 1040, but the roll-to-roll process may also be applied even when the interposer 1010 is smaller than the first substrate 1040. In the former case, the first substrate 1040 may be a new driving substrate, and operations S101 to S106 may be repeated for the new driving substrate. In the latter case, the first substrate 1040 may be a driving substrate where the mLEDs 1020 are transferred on some region of the driving substrate by operations S101 to S106. In this case, the first substrate 1040 may be divided into a first region to which micro LEDs 1020 are transferred and a second region to which no micro LED is transferred, and operations S101 to S106 may be repeated on the second region.

Referring to FIG. 10, even when the interposer 1010 is not flexible, the interposer 1010 may be disposed inside the belt BT or disposed on the belt BT, and thus operations S101 to S106 may be repeated.

Referring to FIG. 11, the interposer 1010 may be recycled in a step-and-repeat process to repeat operations S101 to S106. The step-and-repeat process may be suitable when the first substrate 1040 has the same size as or is larger than the interposer 1010. In the step-and-repeat process, the first substrate 1040 may be a driving substrate, and the first substrate 1040 may be divided into a first region 1040A to which the micro LEDs 1020 are transferred and a second region 1040B to which the micro LEDs 1020 are not transferred. Through repetition of operations S101 to S106, the micro LEDs 1020 may be transferred to the second region 1040B, and thus the entire first substrate 1040 may be regions on which the micro LEDs 1020 are transferred.

According to a method of manufacturing a display through repetitive operations as described above according to example embodiments, a large-size micro LED display may be manufactured at a faster speed than a related pick-and-place method. Also, a micro LED display manufactured according to the method as described above according to example embodiments may have a large area without the need for a separate tiling process. Furthermore, micro LEDs may be transferred to a large-size driving substrate at a high speed by radiating light to the entire penetrating solvent L2 according to the PWM technique.

In the method of manufacturing a display according to an example embodiment, instead of using the penetrating solvent L2, a laser active blister layer may be included in an interposer.

Figure 12:
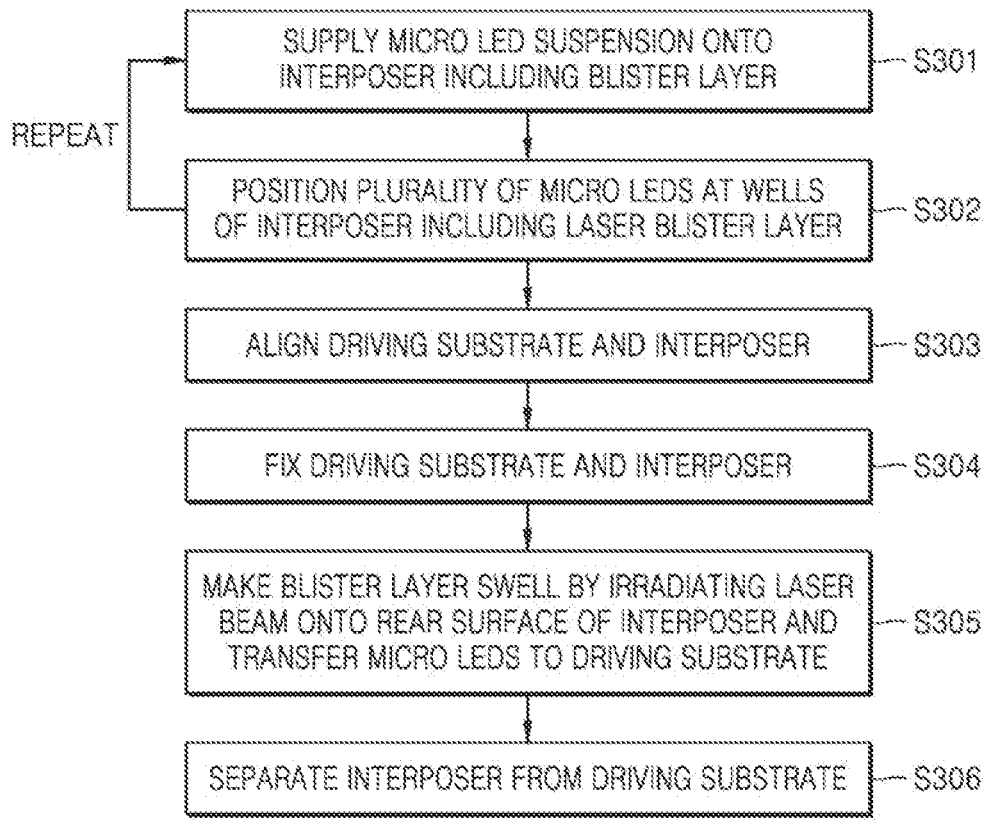
FIG. 12 is a flowchart showing laser-transferring of micro LEDs onto a driving substrate by using a laser active blister layer instead of a penetrating solvent.
Figure 13:
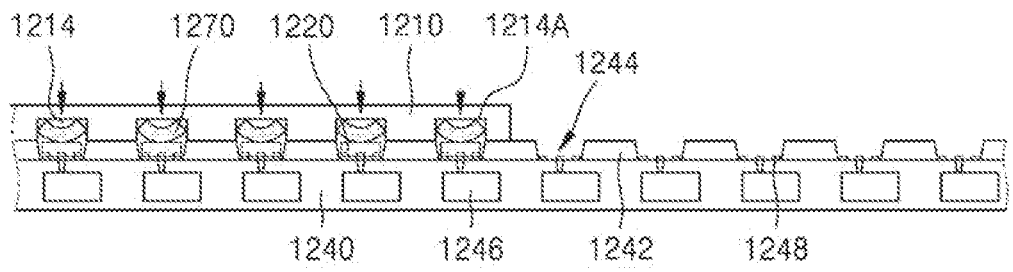
FIG. 13 is a cross-sectional view of laser-transferring of micro LEDs onto a driving substrate by activating a blister layer with a laser beam.

FIG. 12 is a flowchart showing laser-transferring of micro LEDs onto a driving substrate by using a laser active blister layer instead of a penetrating solvent, and FIG. 13 is a cross-sectional view of laser-transferring of micro LEDs onto a driving substrate by activating a blister layer with a laser beam.

Referring to FIGS. 12 and 13, a plurality of micro LEDs are transferred to a plurality of wells on an interposer including a laser active blister layer 1270 through a FSA process (first operation). A transfer operation (the first operation) may include supplying the suspension L1 containing a plurality of micro LEDs 1220 to an interposer 1210 (operation S301) and positioning the plurality of micro LEDs 1220 at a plurality of wells 1214 through at least one of a blade, a roller, or an absorbing member (operation S302). The operations S301 and S302 may be repeated when there is insufficient solvent of the suspension L1 or insufficient micro LEDs 20.

The suspension L1 including the plurality of micro LEDs 1220 is supplied on the interposer 1210 including the plurality of wells 1214 and the laser active blister layer 1270 (operation S301). The interposer 1210 includes the plurality of wells 1214 and a substrate top surface 1216, which is a portion of a surface where the plurality of wells 1214 are not formed on, and the wells 1214 each includes a well bottom 1214A, a well sidewall, and the laser active blister layer 1270 over the well bottom 1214A. When a laser beam is radiated onto the laser active blister layer 1270, the laser active blister layer 1270 is activated thereby and may swell in directions away from the interposer 1210.

The plurality of micro LEDs 1220 are respectively placed in the plurality of wells 1214 through a FSA process (operation S302). Thereafter, a driving substrate 1240 is aligned on the interposer 1210 (operation S303) (second operation). The alignment may be performed through align markers AM. Thereafter, the interposer 1210 and the driving substrate 1240 are fixed without a process of separately injecting a penetrating solvent (operation S304). Operations S301, S302, S303, and S304 are substantially the same as the alignment of operations S101, S102, and S103 and the fixation of operation S103, and thus detailed descriptions thereof will be omitted.

When a laser beam is radiated to the rear surface of the interposer 1210, the laser active blister layer 1270 in contact with the well bottom 1214A is activated and swells, and the micro LEDs 1220 are pushed out of the interposer 1210 and transferred to a groove 1244 of the driving substrate 1240 (operation S305) (fourth operation). A laser beam may be radiated to each well, or a laser beam may be radiated to the entire rear surface of the interposer 1210 to achieve a faster process. When the micro LEDs 1220 are transferred to the groove 1244 of the driving substrate 1240, a process like soldering, ACF, or attachment using a lead wire may be applied for fixation. Thereafter, the interposer 1210 may be separated from the driving substrate 1240 (operation S306). Since the process that the laser active blister layer 1270 is activated by a laser beam and swells is an irreversible process, the interposer 1210 therefor is not reusable. The driving substrate 1240 may include a first region to which the micro LEDs 1220 are transferred and a second region to which the micro LEDs 1220 are not transferred. In operations S301 to S305, a transfer process may be repeatedly performed on a portion of the second region of the driving substrate 1240, to which the micro LEDs 1220 are not yet transferred, in the step-and-repeat process by using a new substrate including the laser active blister layer 1270.

Since a laser transfer does not use a penetrating solvent, a process of removing a remaining penetrating solvent may not be included, and, when all of micro LEDs are transferred onto a driving substrate after a step-and-repeat process, a passivation layer may be formed.

Figure 14A:
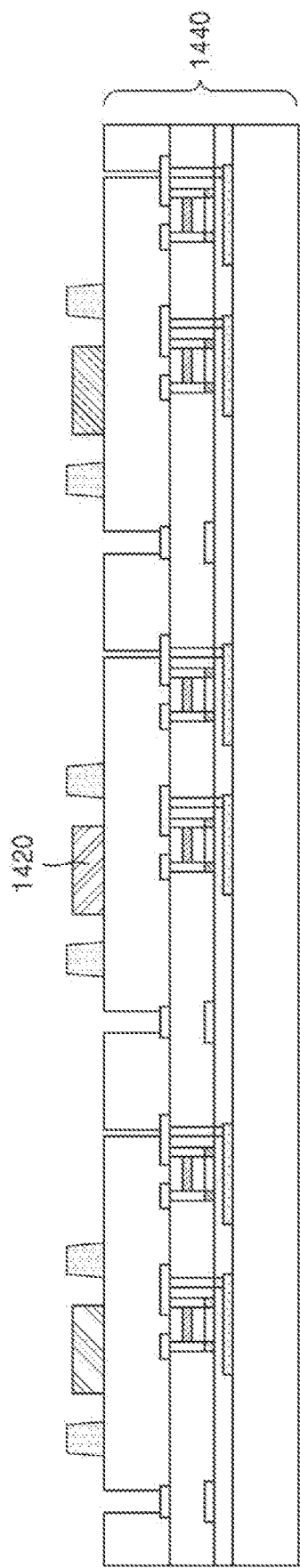
FIG. 14A is a diagram showing a driving substrate onto which micro LEDs are transferred.
Figure 14B:
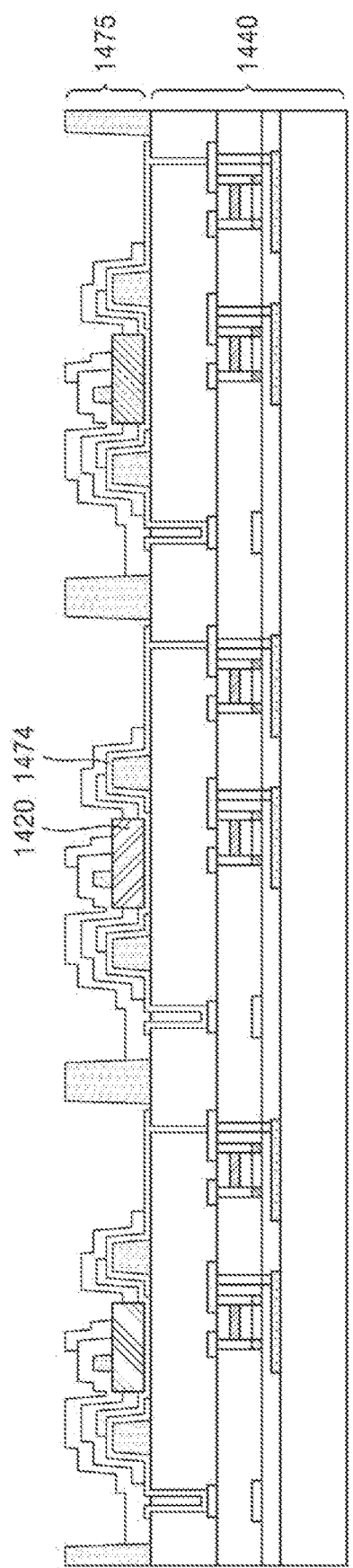
FIG. 14B is a diagram showing that a pattern like an electrode is formed on a driving substrate.
Figure 14C:
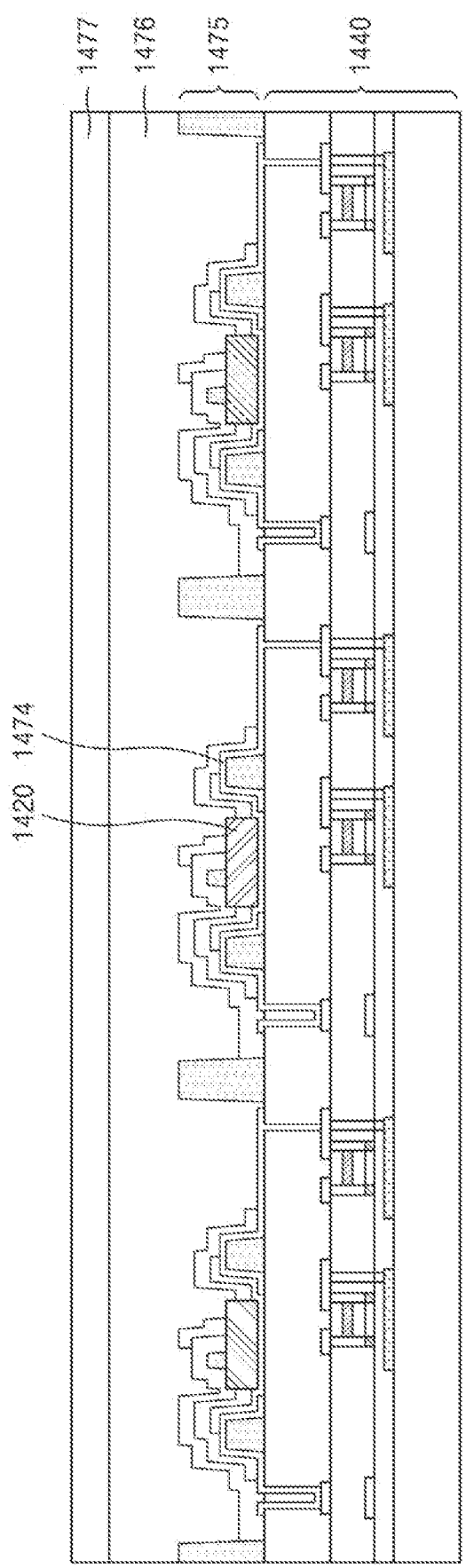
FIG. 14C is a diagram showing that a passivation layer is formed on an emission layer including micro LEDs.
Figure 14D:
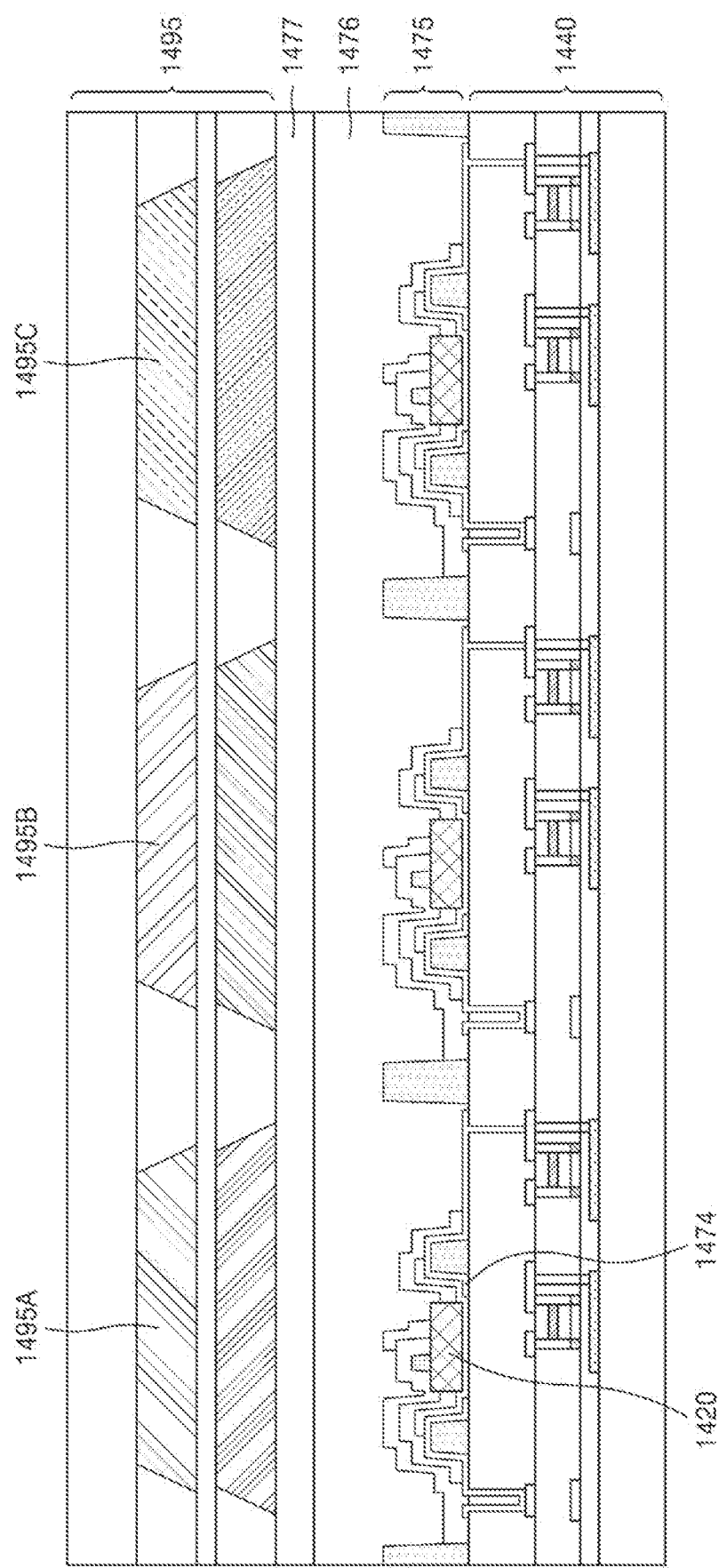
FIG. 14D is a diagram showing formation of a color conversion layer on a passivation layer.

FIG. 14A is a diagram showing a driving substrate 1440 onto which micro LEDs are transferred, FIG. 14B is a diagram showing that a pattern like an electrode is formed on the driving substrate 1440, FIG. 14C is a diagram showing that a passivation layer 1476 is formed on an emission layer 1475 including micro LEDs, and FIG. 14D is a diagram showing formation of a color conversion layer 1495 on the passivation layer 1476.

Referring to FIGS. 14A, 14B, and 14C, a driving substrate to which a transfer process is completed may be electrically connected to micro LEDs through electrode pads or the like. To this end, various patterning may be performed. After various patterns 1474 are stacked, the passivation layer 1476 may be formed on the emission layer 1475. When a plurality of transferred micro LEDs are LEDs emitting blue light B, a separate color conversion layer may be formed to realize different colors.

FIG. 14A shows the driving substrate 1440 after micro LEDs 1420 are transferred.

Referring to FIG. 14B, patterning may be performed on the driving substrate 1440 on which the micro LEDs 1420 are transferred, for electrical connection and/or fixation between the micro LEDs 1420 and the driving substrate 1440. The patterns 1474 may include an electrode layer pattern for electrical connection between the micro LEDs 1420 and a TFT and an insulation layer pattern for electrical insulation and fixation. However, embodiments are not limited thereto, and various other patterns may be patterned. In this case, an operation of removing a penetrating solvent remaining after a transfer process may be included before a patterning operation. For example, a penetrating solvent may be removed through vaporization and/or blowing.

Referring to FIG. 14C, a micro LED display module may be formed by forming a passivation layer for planarization and prevention of introduction of foreign substances from the outside and corrosion. A micro LED display module according to an example embodiment may include the emission layer 1475 including the driving substrate 1440 and the micro LEDs 1420 and the passivation layer 1476, and the passivation layer 1476 may be covered by a glass 1477.

Through the above-stated processes, it is possible to implement a display module that implements full color based on image information by designating red, green, and blue for each pixel. To implement full color, a RGB color display method of transferring LEDs for red (R) light, green (G) light, and blue (B) light to each pixel of a driving substrate or a color conversion layer application method of transferring B LEDs to all pixels of the driving substrate and additionally forming corresponding color conversion layers only for pixels corresponding to R and G may be used.

When R LEDs, G LEDs, and B LEDs are transferred to the driving substrate during a transfer process, an operation of forming an additional color conversion layer on the micro LED module may not be necessary. However, when only B LEDs are transferred to the driving substrate during the transfer process, an additional operation of forming a color conversion layer in the micro LED module may be necessary.

FIG. 14D shows a micro LED module further including the color conversion layer 1495 on the passivation layer 1476. The color conversion layer 1495 may convert the color of light emitted from the micro LEDs 1420. For example, the micro LED 1420 may emit B light. However, it is merely an example, and light of other wavelengths capable of exciting the color conversion layer 1495 may also be emitted.

The color conversion layer 1495 may include a first color conversion layer 1495A that converts the color of light from the micro LED 1420 into a first color, a second color conversion layer 1495B that converts the color of light into a second color, and a third color conversion layer 1495C that converts the color of light into a third color. For example, the first color may be red, the second color may be green, and the third color may be blue.

When the micro LED 1420 emits B light, the first color conversion layer 1495A may convert B light into R light, the second color conversion layer 1495B may convert B light into G light, and the third color conversion layer 1495C may be a layer including a resin that transmits B light without color conversion.

In the above example, the first color conversion layer 1495A or the second color conversion layer 1495B that actually converts color may include quantum dots QD that are excited by B light and emit R light or G light, and the quantum dots QD may have a core-shell structure having a core portion and a shell portion or a particle structure without a shell. The core-shell structure may be a single-shell structure or multi-shell structure, e.g., a double-shell structure.

The quantum dots QD may include a Group II-VI semiconductor, a Group III-V semiconductor, a Group IV-VI semiconductor, a Group IV semiconductor, and/or graphene quantum dots. The quantum dots QD may include, for example, cadmium (Cd), selenium (Se), zinc (Zn), sulfur (S) and/or indium phosphide (InP), and each quantum dot QD may have a diameter of dozens of nm or less, e.g., a diameter of about 10 nm or less.

Also, in the above example, the first color conversion layer 1495A or the second color conversion layer 1495B for color conversion may include phosphor that is excited by B light and emits R light or G light.

Also, when the micro LEDs 1420 emit G light, the color conversion layer 1495 for converting G light into R light may be used.

A method of manufacturing a micro LED display according to an example embodiment may efficiently transfer micro LEDs to a large-size driving substrate through a FSA method.

A method of manufacturing a micro LED display according to an example embodiment may transfer micro LEDs aligned in one direction to a driving substrate at once by using an interposer.

A method of manufacturing a micro LED display according to an example embodiment may increase micro LED display productivity by recycling an interposer.

A method of manufacturing a micro LED display according to an example embodiment may manufacture a large-size micro LED display by repeatedly transferring micro LEDs to a large driving substrate.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. A method of manufacturing a display, the method comprising:
    a first operation of transferring a plurality of micro light emitting diodes (LEDs) to a plurality of wells of an interposer through a fluidic self assembly (FSA) process;
    a second operation of aligning a driving substrate on the interposer;
    a third operation of injecting a penetrating solvent between the interposer and the driving substrate, such that the penetrating solvent penetrates between the plurality of micro LEDs and the plurality of wells; and
    a fourth operation of transferring the plurality of micro LEDs to the driving substrate by radiating light to the interposer to vaporize the penetrating solvent.

2. The method of claim 1, wherein the penetrating solvent is a volatile liquid having an evaporation point of 100° C. or lower.

3. The method of claim 1, wherein the penetrating solvent comprises one or a combination of a plurality of liquids including water, alcohol, polyol, ketone, halocarbon, acetone, flux, and organic solvents.

4. The method of claim 1, wherein the plurality of wells have a depth of 0.5 to 1.5 times a thickness of one of the plurality of micro LEDs.

5. The method of claim 1, wherein the light is infrared light, and
    wherein the light is radiated based on a pulse width modulation (PWM) technique.

6. The method of claim 1, wherein the fourth operation further comprises fixing the plurality of micro LEDs to the driving substrate based on at least one of soldering, anisotropic conductive film (ACF), and attachment using a lead wire.

7. The method of claim 1, wherein the second operation further comprises aligning the driving substrate on the interposer based on align markers, and
    wherein the align markers are at least one of separate marks or pixel positions on the interposer and the driving substrate.

8. The method of claim 1, further comprising, after the fourth operation, removing the penetrating solvent remaining on the interposer and the driving substrate.

9. The method of claim 1, further comprising, after the fourth operation, cleaning surfaces of the interposer.

10. The method of claim 1, wherein the first operation further comprises:
    supplying a suspension comprising the plurality of micro LEDs to the interposer;
    positioning the plurality of micro LEDs at the plurality of wells through at least one of a blade, a roller, or an absorbing member; and
    removing the suspension.

11. The method of claim 10, wherein the plurality of micro LEDs are supplied to the interposer based on at least one of a method of spraying the suspension comprising the plurality of micro LEDs onto the interposer, a dispensing method, an inkjet dot method, or a method of flowing the suspension to the interposer.

12. The method of claim 10, wherein the positioning comprises scanning at least one of the blade, the roller, or the absorbing member on the interposer, and
    wherein the scanning is performed through one or a combination of reciprocating motion, translational motion, rotational motion, rolling motion, rubbing motion, and spinning motion of at least one of the blade, the roller, or the absorbing member.

13. The method of claim 10, wherein the suspension comprises one or a combination of a plurality of liquids including water, alcohol, polyol, ketone, halocarbon, acetone, flux, and organic solvents.

14. The method of claim 1, wherein the interposer comprises a flexible material, the interposer is recycled, and
    wherein the first operation, the second operation, the third operation, and the fourth operation are performed in a roll-to-roll process.

15. The method of claim 1, wherein the driving substrate comprises a first region to which micro LEDs among the plurality of micro LEDs are transferred and a second region to which a micro LED among the plurality of micro LEDs is not transferred, and wherein the first operation, the second operation, the third operation, and the fourth operation are performed on a portion of the second region by recycling the interposer.

16. The method of claim 1, wherein the driving substrate comprises electrode pads electrically connected to the plurality of micro LEDs and thin-film transistors (TFTs) electrically connected to the electrode pads.

17. The method of claim 1, further comprising providing a passivation layer on the driving substrate to which the plurality of micro LEDs are transferred.

18. The method of claim 17, further comprising providing a color conversion layer on the passivation layer.

* * * * *